Dec. 23, 1969 R. L. JAMES 3,486,133
PULSE GENERATOR
Filed June 25, 1968
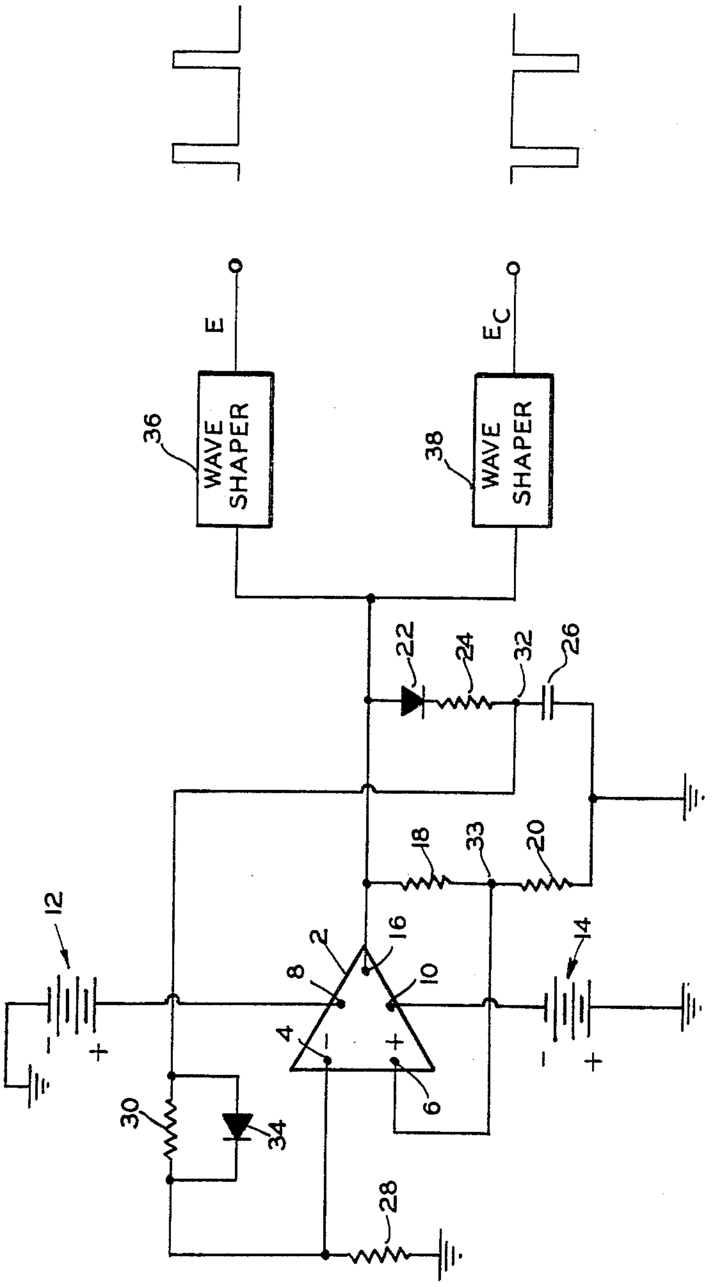
INVENTOR.
ROBERT L. JAMES
BY
ATTORNEY

United States Patent Office 3,486,133

Patented Dec. 23, 1969

3,486,133

PULSE GENERATOR

Robert L. James, Bloomfield, N.J., assignor to The Bendix Corporation, a corporation of Delaware Continuation-in-part of application Ser. No. 715,810, Mar. 25, 1968. This application June 25, 1968, Ser. No. 739,802

Int. Cl. H03k 3/26

U.S. Cl. 331—111 6 Claims

ABSTRACT OF THE DISCLOSURE

A pulse generator including an operational amplifier and a capacitor connected to the output of the amplifier. The amplifier output voltage is fed back in opposite senses causing the amplifier to alternately saturate in first one and then the other sense whereby the capacitor alternately charges and discharges. Wave shaping circuitry connected to the amplifier provides complementary pulses having a predetermined wave shape.

CROSS REFERENCE TO RELATED APPLICATIONS

This application is a division and a continuation-in-part for all common subject matter of U.S. application Ser. No. 715,810 filed Mar. 25, 1968 by Robert L. James and assigned to The Bendix Corporation, assignee of the present invention.

BACKGROUND OF THE INVENTION

Field of the invention

This invention relates to pulse generators and, more particularly, to pulse generators having simplified construction and increased reliability and stability.

Description of the prior art

Prior to the present invention devices of the type described required complex and costly circuitry and had relatively slow response. The device of the invention overcomes these disadvantages by featuring simplicity, reduced weight and volume, relatively fast response and, additionally, increased reliability.

SUMMARY OF THE INVENTION

This invention contemplates a pulse generator including an amplifier having inverting and non-inverting inputs and a capacitor connected to the amplifier output. The amplifier is initially saturated in one sense and maintained thereat by the amplifier output which is fed back to the non-inverting input. A charge in the one sense builds up on the capacitor, and which charge is fed back to the inverting input of the amplifier with a portion of the charge appearing across a resistor connecting said inverting input to ground. When the voltage across the resistor slightly exceeds in the one sense the voltage fed back to the non-inverting input, the amplifier switches to saturation in the opposite sense and voltage to the capacitor is blocked causing the capacitor to discharge toward ground. When the capacitor voltage is slightly less in the one sense than the voltage applied to the non-inverting input, the amplifier switches back to saturation in the one sense and the cycle repeats. Wave shaping circuitry connected to the amplifier output provides complementary pulses having a predetermined wave shape.

One object of this invention is to provide a pulse generator having simplified circuitry, reduced weight and size and relative high stability and reliability.

Another object of this invention is to provide a pulse generator including an operational amplifier, and whereby pulses are generated by alternately driving the amplifier to saturation in opposite senses.

Another object of this invention is to provide feedback means for alternately driving the amplifier to saturation in opposite senses.

Another object of this invention is to provide means connected to the output of the amplifier for providing complementary pulses saving a predetermined wave form.

The foregoing and other objects and advantages of the invention will appear more fully hereinafter from a consideration of the detailed description which follows, taken together with the accompanying drawing wherein one embodiment of the invention is illustrated by way of example. It is to be expressly understood, however, that the drawing is for illustration purposes only and is not to be construed as defining the limits of the invention.

DESCRIPTION OF THE DRAWINGS

The single figure in the drawing is an electrical schematic diagram showing a pulse generator according to the invention.

DESCRIPTION OF THE INVENTION

An operational amplifier 2 has an inverting input 4, a non-inverting input 6 and power inputs 8 and 10, with power input 8 connected to a source of positive direct current shown as a battery 12 and power input 10 connected to a source of negative direct current shown as a battery 14. Operational amplifier 2 has an output 16 which is connected to ground through a resistor 18 and a resistor 20. Output 16 is connected to a capacitor 26 through a diode 22 and a resistor 24.

Inverting input 4 of amplifier 2 is connected to ground through a resistor 28 and is connected to a point 32 intermediate resistor 24 and capacitor 26 through a diode 34 and a resistor 30 connected in parallel. Non-inverting input 6 of amplifier 2 is connected to a point 33 intermediate resistors 18 and 20.

Output 16 of amplifier 2 is connected to a wave shaper 36 which shapes the output from amplifier 2 and provides a pulse E having, by way of example, a wave form as shown in the drawing. Output 16 is connected to a wave shaper 38 which shapes the output from amplifier 2 and provides a pulse $E_c$ as shown in the drawing, and which pulse $E_c$ is the complement of pulse E provided by wave shaper 36.

For purposes of illustration, amplifier 2 is considered to be saturated in the positive sense providing a positive voltage at output 16 of amplifier 2, and is maintained in this condition by the output from output 16 fed back through the positive feedback path to non-inverting input 6 of the amplifier. When amplifier 2 is so saturated a positive voltage is applied through the series combination of diode 22 and resistor 24 to capacitor 26. A positive charge builds up on capacitor 26, and which charge is fed back to inverting input 4 of amplifier 2 through the negative feedback path including the parallel combination of diode 34 and resistor 30.

A portion of the feedback applied through the negative feedback path appears across resistor 28 which connects inverting input 4 to ground, and when the voltage across resistor 28 is slightly more positive than the feedback voltage applied to non-inverting input 6 of amplifier 2, amplifier 2 rapidly switches to a state of negative saturation providing a negative voltage at output 16. Diode 22 blocks this negative voltage from passing to capacitor 26, whereupon capacitor 26 discharges through the negative feedback path to inverting input 4 causing the voltage applied through said feedback path to decrease toward ground. When this voltage is slightly less positive than the voltage applied to non-inverting input 6, amplifier 2 switches back to positive saturation and the cycle repeats.

Pulse shapers 36 and 38 are connected to output 16 of amplifier 2 and respond to the output voltage thereat for providing pulses E and $E_c$ having wave forms as shown in the drawing.

As may be seen from the foregoing description, the present invention has the advantages of simplified circuitry, with an associated increase in reliability, and relatively high stability. In this connection it is to be noted that a stabilizing affect is provided by the negative feedback since a drift in the output of amplifier 2 is prevented by said negative feedback. This feature, together with the aforenoted features of simplicity and increased reliability, enhance the value of the invention especially when used as a timing pulse generator for automatic control systems.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A pulse generator comprising:

an operational amplifier having an inverting input, a non-inverting input and an output, and said amplifier beig initially saturated in one sense for providing a voltage in the one sense at the output;

feedback means connected to the output and to the non-inverting input of the amplifier for feeding back the voltage in the one sense to maintain the amplifier saturated in the one sense;

other feedback means connected to the output and to the inverting input of the amplifier for feeding back the voltage in the one sense;

a resistor connected to the other feedback means and to the inverting input of the amplifier for rendering the amplifier saturated in a sense opposite to the one sense and for providing an output voltage in the opposite sense when the voltage across the resistor slightly exceeds in the one sense the voltage at the non-inverting input; and means connected to the amplifier output and responsive to the output voltages in the one and the opposite senses for providing complementary pulses having a predetermined waveform.

2. A pulse generator as described by claim 1, wherein:

the amplifier is rendered saturated in the one sense for providing the voltage in the one sense at the amplifier output when the voltage fed back through the other feedback means to the inverting input is slightly less in the one sense than the voltage fed back through the first mentioned feedback means to the non-inverting input.

3. A pulse generator as described by claim 1, wherein the other feedback means includes:

a current flow control device connected to the output of the amplifier for passing the voltage thereat in the one sense and for blocking the voltage in the opposite sense;

a capacitor connected to the current flow control device and charged by the voltage in the one sense passed thereby; and the inverting input of the amplifier being connected intermediate the current flow control device and the capacitor so that the charge on the capacitor is applied to the non-inverting input, with the capacitor discharging to said non-inverting input when the voltage in the opposite sense is blocked from the capacitor.

4. A pulse generator as described by claim 3, wherein:

a resistor is serially connected to the current flow control device;

the capacitor is serially connected to the resistor; and the inverting input of the amplifier is connected intermediate the resistor and the capacitor.

5. A pulse generator as described by claim 3, including:

a resistor and another current flow control device connected in parallel with one another and the parallel combination connected intermediate the first mentioned current flow control device and the capacitor and connected to the inverting input of the amplifier.

6. A pulse generator as described by claim 1, wherein the first mentioned feedback means includes:

a first resistor connected to the amplifier output;

a second grounded resistor connected to the first resistor; and the non-inverting input being connected intermediate the first and second resistors.

References Cited

IBM Tech. Disc. Bul. Arnold et al., "Crystal Oscillator," vol. 9, No. 7, December 1966, pp. 943, 944, 331–116.

JOHN KOMINSKI, Primary Examiner

U.S. Cl. X.R.

331—143, 108, 61; 330—38